United States Patent
Kudo

(10) Patent No.: US 7,737,672 B2
(45) Date of Patent: Jun. 15, 2010

(54) SEMICONDUCTOR CIRCUIT AND SWITCHING POWER SUPPLY APPARATUS

(75) Inventor: Ryotaro Kudo, Tokyo (JP)

(73) Assignee: Renesas Technology Corp., Tokyo (JP)

(*) Notice: Subject to any disclaimer, the term of this patent is extended or adjusted under 35 U.S.C. 154(b) by 177 days.

(21) Appl. No.: 12/138,133

(22) Filed: Jun. 12, 2008

(65) Prior Publication Data
US 2009/0039843 A1 Feb. 12, 2009

(30) Foreign Application Priority Data
Aug. 8, 2007 (JP) ............... 2007-206074

(51) Int. Cl.
*G05F 1/00* (2006.01)
(52) U.S. Cl. .................. 323/284; 323/271; 323/272
(58) Field of Classification Search .......... 323/283, 323/284, 271, 272
See application file for complete search history.

(56) References Cited

U.S. PATENT DOCUMENTS 6,784,644 B2 * 8/2004 Xu et al. .............. 323/225
7,173,400 B2 2/2007 Morioka

FOREIGN PATENT DOCUMENTS

JP 2005-168106 6/2005

* cited by examiner

*Primary Examiner*—Shawn Riley
(74) *Attorney, Agent, or Firm*—Mattingly & Malur, P.C.

(57) ABSTRACT

To provide a power supply apparatus which realizes a high-speed response, a stable operation, and a low output ripple with low power consumption. The first stage switching regulator receives an input voltage and forms a first voltage. The second stage switching regulator receives the first voltage and forms a second voltage. The second stage switching regulator includes an N-phase (N is two or more) switching regulator, and the first voltage is set to be N times a target value of the second voltage. The input voltage is set to be higher than the first voltage.

11 Claims, 9 Drawing Sheets

US 7,737,672 B2

SEMICONDUCTOR CIRCUIT AND SWITCHING POWER SUPPLY APPARATUS

CROSS-REFERENCE TO RELATED APPLICATION

The present application claims priority from Japanese patent application No. 2007-206074 filed on Aug. 8, 2007, the content of which is hereby incorporated by reference into this application.

BACKGROUND OF THE INVENTION

The present invention relates to a power supply apparatus and relates to a technology effective for an application to a switching power supply apparatus to convert a higher voltage into a lower voltage, for example.

A technology for a purpose of reducing an output ripple current/voltage of a multi-phase DC/DC converter is disclosed in Japanese Unexamined Patent Publication No. 2005-168106 (Patent Document 1). This multi-phase power supply apparatus includes a multi-phase PWM control DC/DC converter power supply unit having N DC/DC converters coupled in parallel, a detection means detecting a voltage value of an output power from the multi-phase PWM control DC/DC converter power supply unit, a power supplying means supplying power to the multi-phase PWM control DC/DC converter power supply unit, and a control means controlling the voltage value of the output power from the power supplying means to be N times the voltage value detected by the detection means.

SUMMARY OF THE INVENTION

Recently, an operation frequency has been increasing year by year for improving a processing capability of a system controlling unit (memory, CPU, and GPU) or the like mounted in PCs (personal computers) and servers, and a power supply voltage thereof has been reduced. Because of the higher frequency operation, a current consumption has been increased, and also a leak current caused by the low voltage has been increased. Accordingly, a power supply apparatus is desired to have a high accuracy in a power supply voltage, a high speed response to prevent a power supply voltage drop in a sudden load change, and a stable operation.

The power supply apparatus of the above Patent Document 1 aims to reduce a ripple current/voltage, resulting in sacrificing stability against a drop or rise of the power supply voltage in a sudden load change. That is, for a drop (rise) of an output voltage in the sudden load change, the above described power supply means operates such that a value of input voltage change becomes N times a value of output voltage change in order to make the input voltage supplied to the multi-phase PWM control DC/DC converter power supply unit to follow the above output voltage change, and controls such that an input voltage N times an output voltage is supplied to the multi-phase PWM control DC/DC converter power supply unit. However, the multi-phase PWM control DC/DC converter power supply unit detects the drop (rise) of the power supply voltage in the sudden load change and tries to obtain an original output voltage by changing a PWM pulse duty. Therefore, the above described voltage supply means reduces (or increases) the input voltage to prevent the output voltage in the multi-phase PWM control DC/DC converter power supply unit from returning to the original voltage. The above mentioned load such as a CPU or the like uses a lower power supply voltage as described above and has a small margin particularly against a voltage drop. Even though such a voltage drop may probably cause an error in operation of the CPU or the like and a quick recovery of the power supply voltage is needed, the above power supply apparatus of the Patent Document 1 cannot meet the need.

The Patent Document 1 forms the N time voltage value from the power supply by a control of an on-resistance of a transistor 1. For example, when the power supply voltage is 12 V and 1 V is formed therefrom in a two-phase complementary PWM control DC/DC converter power supply unit, the above mentioned power supplying means needs to form a voltage of 2 V. In this case, the transistor 1 composing the power supplying means has a voltage difference of as large as 10 V between a collector and an emitter thereof. This voltage difference increases further when 20 V is used for the power supply. There is also a problem that a power loss in the transistor 1 may become enormous in a possible case in which an output current of the power supply becomes as large as 100 A.

An object of the present invention is to provide a power supply apparatus realizing a high-speed response, a stable operation, and a low output ripple with low power consumption. The above described and other objects and novel features of the present invention will be apparent from the description of the present specification and the accompanying drawings.

An embodiment of a power supply apparatus disclosed by the present application is as follows. The first stage switching regulator forms a first voltage by receiving an input voltage. The second stage switching regulator forms a second voltage by receiving the first voltage. The second stage switching regulator is configured by an N-phase (N is two or more) switching regulator and the first voltage is set to be N times a target value of the second voltage. The input voltage is set to be higher than the first voltage.

Since the first stage switching regulator and the second stage switching regulator are PWM-controlled to have output voltages set for the respective switching regulators, it is possible to realize a high response time, a stable operation, and a low output ripple with low power consumption.

DETAILED DESCRIPTION OF THE PREFERRED EMBODIMENTS

Figure 1:
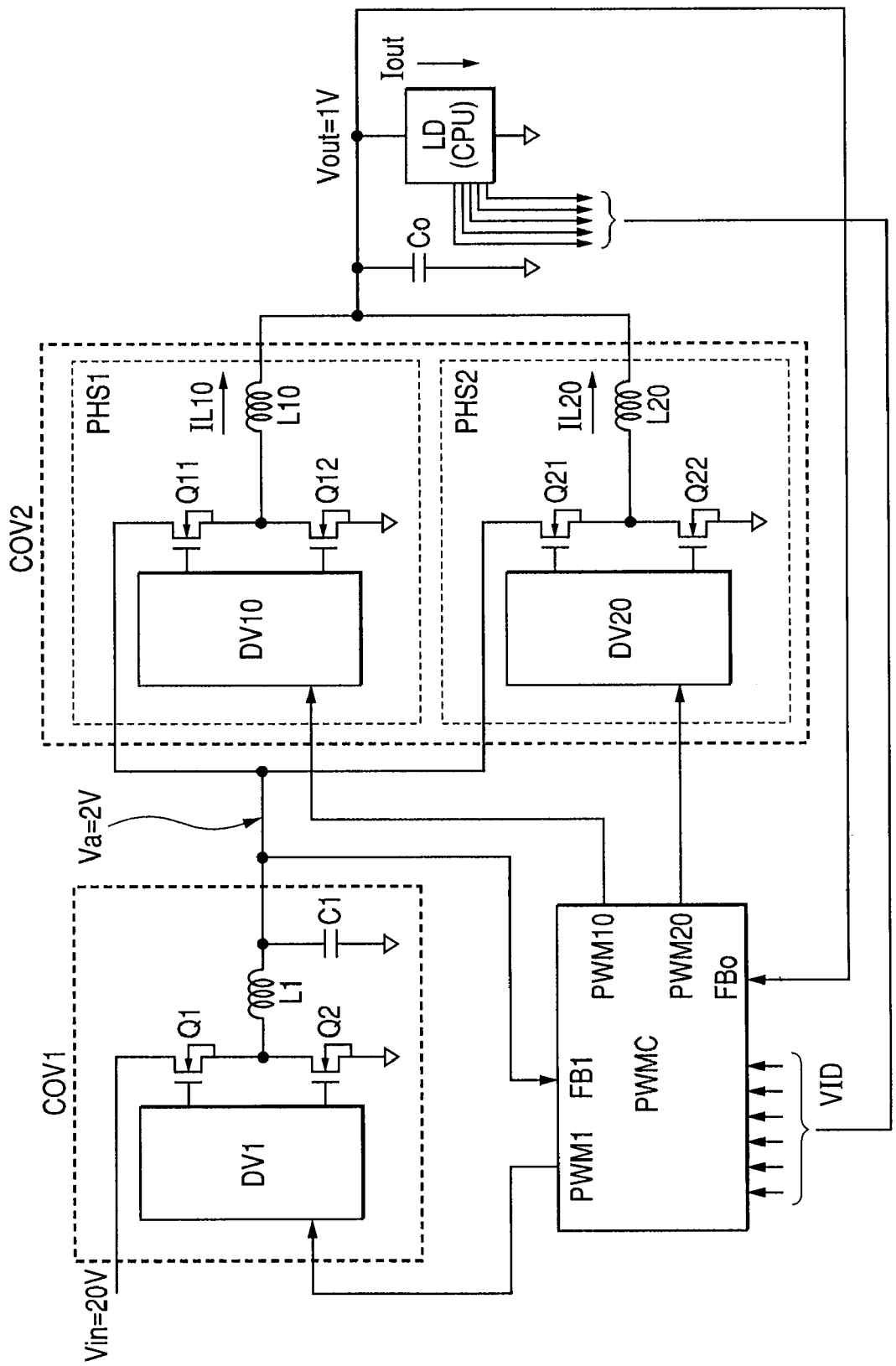
FIG. 1 is a block diagram of an embodiment of a power supply apparatus according to the present invention.

FIG. 1 shows a block diagram of an embodiment of a power supply apparatus according to the present invention. In this embodiment, a first stage DC-DC converter COV1 and a second stage DC-DC converter COV2 are combined. The first stage DC-DC converter COV1 includes a drive circuit DV1, output MOSFETs Q1 and Q2, and an inductor L1 and capacitor C1. The first stage DC-DC converter COV1 receives an input voltage Vin and forms an input voltage Va which is set for reducing a ripple in the second stage DC-DC converter COV2. The second stage DC-DC converter COV2 is configured by a multi-phase DC-DC converter receiving the input voltage Va. In this embodiment, the second stage DC-DC converter COV2 is configured by a two-phase circuit having a first-phase circuit PHS1 and a second-phase circuit PHS2. The first-phase circuit PHS 1 includes a drive circuit DV10, output MOSFETs Q11 and Q12, and an inductor L10. The second-phase circuit PHS2 includes a drive circuit DV20, output MOSFETs Q21 and Q22, and an inductor L20. Then, in the second stage DC-DC converter COV2, a capacitor Co is provided commonly to the inductors L10 and L20 to form an output voltage Vout.

The first stage and second stage DC-DC converters COV1 and COV 2 are provided with a PWM control circuit PWMC. The PWM control circuit PWMC receives the output voltage Va from the first stage DC-DC converter COV1 as a feedback signal FB1, and forms a PWM pulse PWM1 so as to make the voltage Va become a target voltage and supplies the PWM pulse PWM1 to the first stage DC-DC converter COV1. The PWM control circuit PWMC also receives an output voltage Vout from the second stage DC-DC converter COV2 as a feedback signal FBo, and forms PWM pulses PWM10 and PWM 20 so as to make the output voltage Vout to become a target voltage and supplies the PWM pulses PWM10 and PWM20 to the first phase circuit PHS1 and the second phase circuit PHS2, respectively, in the second stage DC-DC converter COV2.

While the values of the input voltage Vin and the output voltage Vout do not have any particular limitations, this embodiment sets the input voltage Vin to be 20 V and the output voltage Vout to be 1 V, for example. When the second stage DC-DC converter COV2 is configured by the two-phase circuit as described above, the input voltage Va is set to be 2×Vout=2 V. That is, the PWM control circuit PWMC forms the PWM pulse PWM1 such that the output voltage Va of 2 V is formed from the input voltage Vin of 20 V in the first stage DC-DC converter COV1.

This embodiment assumes that a load circuit LD driven by the output voltage Vout is the system control unit (CPU) mounted in the PC (personal computer) or server. This CPU is provided with a VID code output function specifying an operating voltage. Correspondingly, the power supply apparatus of this embodiment is provided with a VID code input circuit and decode circuit in the PWM control circuit PWMC. By this decode circuit, the output voltage Vout is automatically set to be 1 V in the second stage DC-DC converter COV2, and the output voltage Va is automatically set to be 2 V in the first stage DC-DC converter COV1.

Figure 2:
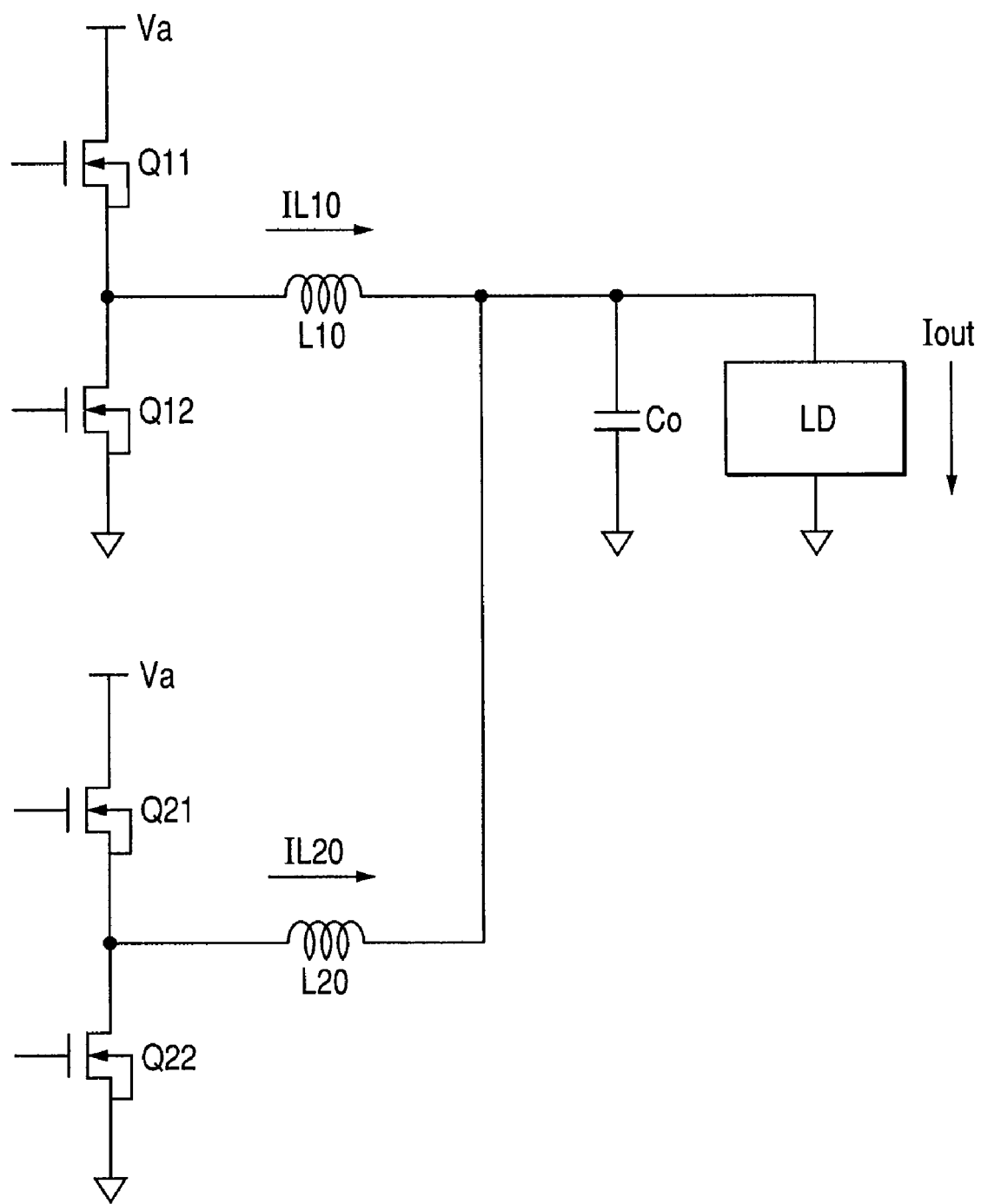
FIG. 2 is a schematic circuit diagram for explaining the operation of the second stage DC-DC converter COV2 according to the present invention.

FIG. 2 shows a schematic circuit diagram for explaining the operation of the second stage DC-DC converter COV2 according to the present invention. In the first-phase circuit PHS1, a current IL10 is supplied to the capacitor Co via the inductor L10, and in the second-phase circuit PHS2, a current IL20 is supplied to the capacitor Co via the inductor L20. In this manner, the capacitor Co is charged by the two currents IL10 and IL20, the capacitor Co is discharged by a load current Iout which flows in the load circuit LD. The output voltage Vout is determined according to such charge/discharge of the capacitor Co.

Figure 3:
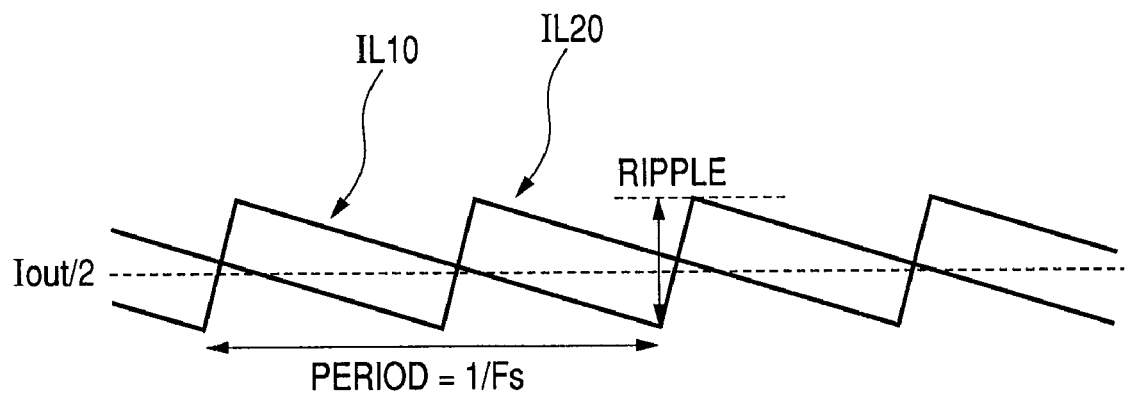
FIG. 3 is a waveform chart of the currents IL10 and IL20 flowing through the inductors L10 and L20 shown in FIG. 1, respectively, and the output current Iout.

FIG. 3 shows a waveform chart of the currents IL10 and IL20 flowing through the inductors L10 and L20, respectively, and the output current Iout. The current IL10 flowing through the inductor L10 changes to increase by a current from the input voltage Va, when the output MOSFET Q11 becomes an on-state and the output MOSFET Q12 becomes an off-state corresponding to a high level of the PWM pulse. When the PWM pulse changes to a low level, the output MOSFET Q11 becomes an off-state and the output MOSFET Q12 becomes an on-state, and then the current IL10 changes to reduce, while discharge of energy stored in the inductor L10 (counter electromotive force) works to maintain the current IL10. Also in the inductor L20, the current IL20 behaves similarly to the current IL10 flowing through the inductor L10, although phases thereof are different from each other by 180 degrees. In a state of constant flow of the output current Iout, an increased current amount and a decreased current amount in the currents IL10 or IL20 are the same for an period of 1/Fs (Fs is a PWM frequency) as shown in the drawing, and an increased magnitude and a decreased magnitude of the currents IL10 or IL20 cause a ripple in the output voltage.

Figure 4:
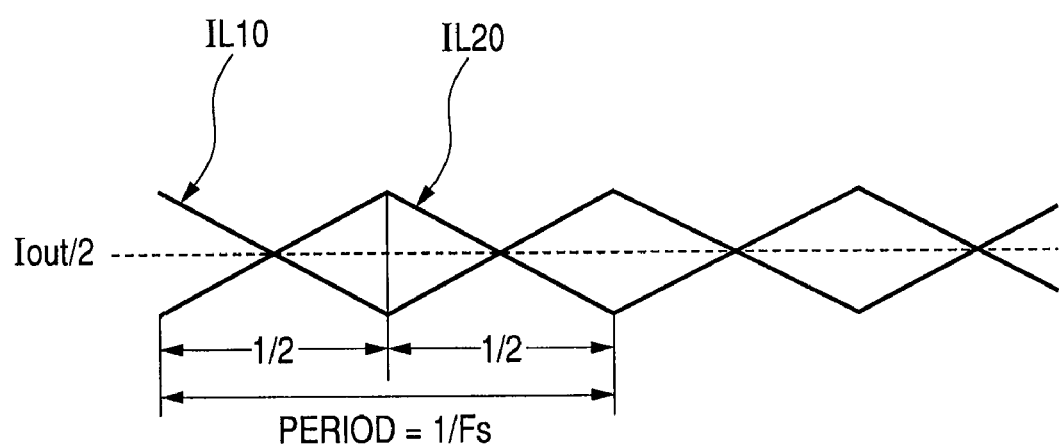
FIG. 4 is a waveform chart showing an example of the currents IL10 and IL20 flowing through the inductors L10 and L20, respectively, and the output current Iout in the second stage DC-DC converter COV2 according to the present invention.

FIG. 4 shows a waveform chart of the currents IL10 and IL20 flowing through the inductors L10 and L20, respectively, and the output current Iout in the second stage DC-DC converter COV2 according to the present invention. When the input voltage Va is set to be two times the output voltage Vout such as 2 V for forming the output voltage Vout of 1 V in the second stage DC-DC converter COV2 as described hereinabove, an increased current amount and a decreased current amount of the currents IL10 and IL20 are the same for the period of 1/Fs (Fs is the PWM frequency) as shown in the drawing for a case of a constant flow of the output current Iout. That is, in the period of 1/Fs, an increase time and a decrease time of the currents IL10 and IL20 become equally a half of the period. Further, since the currents IL10 and IL20 have phases different from each other by 180 degrees as shown in the drawing, a combined current IL10+IL20 always becomes Iout (constant) and the current ripple can be made zero.

Figure 5:
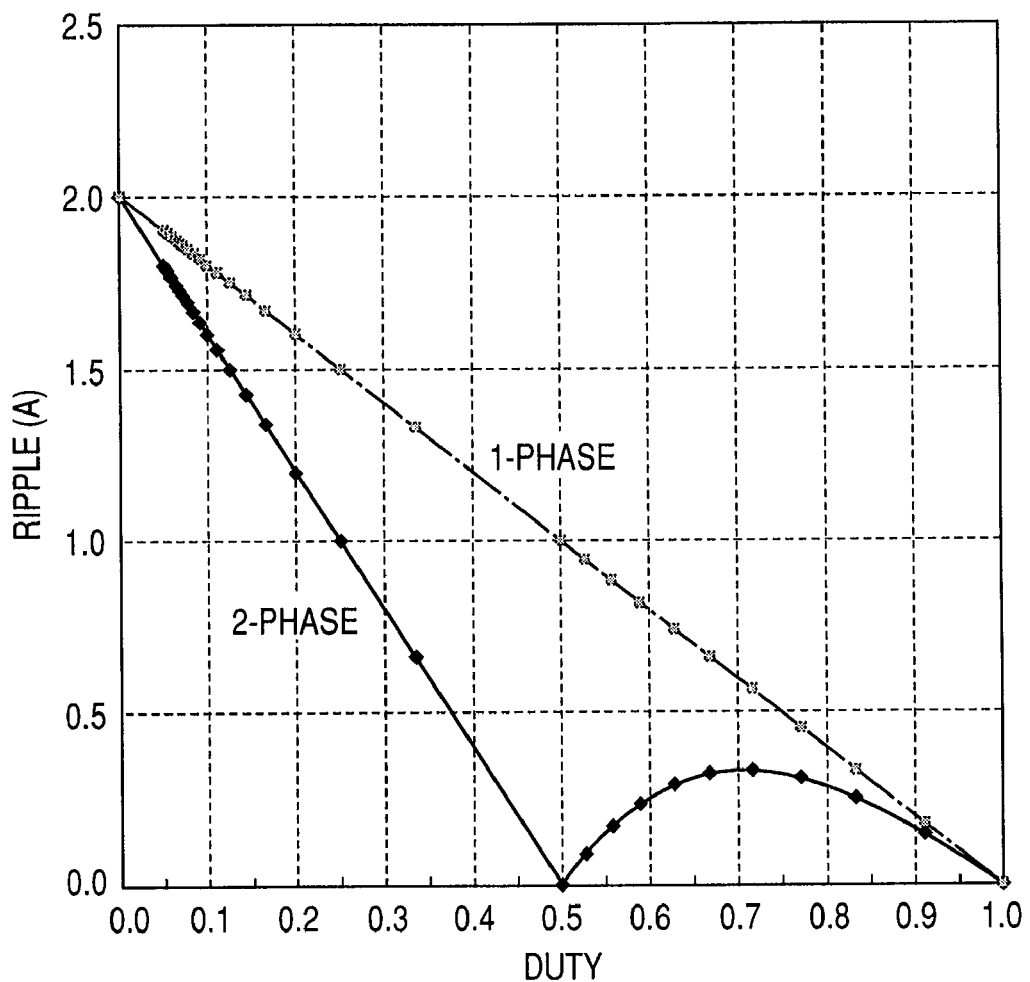
FIG. 5 is a characteristic diagram for explaining the present invention.

FIG. 5 shows a characteristic chart for explaining the present invention. The drawing shows a relationship between a ripple current in the output current of the DC-DC converter and a duty. The duty represents a ratio of the current decrease time to the current increase time in FIG. 4, corresponds to a ratio of the output voltage to the input voltage, and becomes the same as a PWM pulse duty when the output current Iout is constant. In the drawing, the current ripple is calculated by a computer simulation against the duty, when the output voltage is 1 V, Fs=500 KHz, and L10 (L20)=1 pH. Here, it is assumed that the on-resistance of the output MOSFET Q11 (Q21) or the like and the inductor L10 (L20) or the like do not have parasitic resistances.

As apparent from the characteristic chart of FIG. 5, when the duty is around 0.1, more specifically when the input voltage is 20 V, the output voltage is 1 V, and the duty is 0.05, there is little difference between a single-phase DC-DC converter configuration and a two-phase DC-DC converter configuration. The ripple current decreases when the duty is 0.5 and 1.0. For the duty of 0.5, this is understood from that the combined current of IL10 and IL20 becomes Iout (constant) as apparent in FIG. 4. Here, the duty of 1.0 represents a state in which the MOSFET Q11 (Q21) in the DC-DC converter COV2 shown in FIG. 1 is maintaining the on-state and the input voltage Va is directly output as the output voltage Vout via the inductor L10 (L20), and does not represent the operation of the DC-DC converter.

Figure 6:
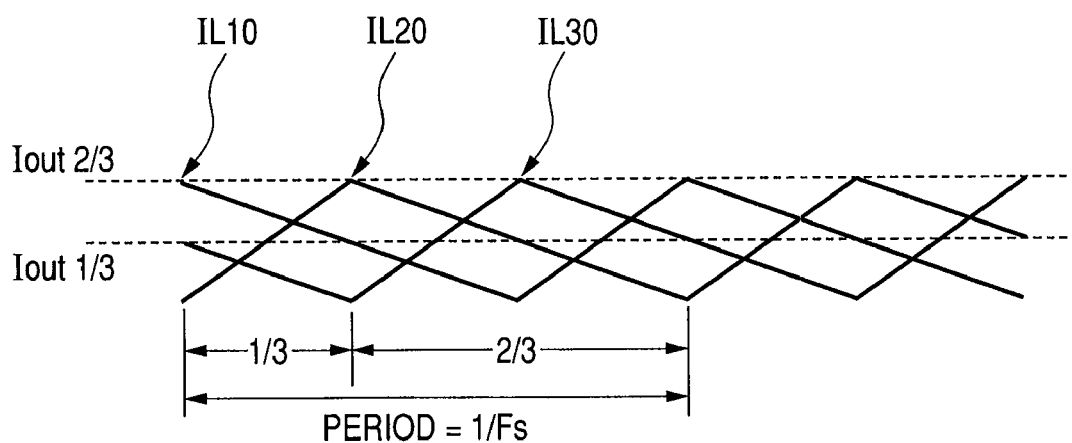
FIG. 6 is a waveform chart of the currents flowing through the respective inductors when the second stage DC-DC converter COV2 is configured by the three-phase DC-DC converter according to the present invention.

FIG. 6 shows a waveform chart of currents flowing through inductors when the second stage DC-DC converter COV2 according to the present invention is configured by a three-phase DC-DC converter. The three-phase converter is provided with a third-phase circuit corresponding to the circuit shown in FIG. 1, including the drive circuit DV10 (DV20), the output MOSFETs Q11 and Q12 (Q21 and Q22), and the inductor L10 (L20). An inductor in the third phase circuit is designated by L30, and the drawing shows a current IL30 flowing the inductor L30.

When the second stage DC-DC converter COV2 is configured by the three-phase converter as described above to form the output voltage Vout of 1 V, the input voltage Va is set to be three times the output voltage Vout such as 3 V. For a case of the constant flow of the output current Iout, a ratio of a decreased current amount to an increased current amount in the current IL10, IL20, or IL30 becomes 1:2 for the period 1/Fs (Fs is a PWM frequency). That is, in the period of 1/Fs, an increase time of the current IL10, IL20, or IL30 becomes one third of the period and a decrease time thereof becomes two third of the period. Further, since phases of the currents IL10, IL20, and IL30 are mutually different by 120 degrees as shown in the drawing, a combined current IL10+IL20+IL30 always becomes Iout (constant) and a current ripple can be made zero.

Figure 7:
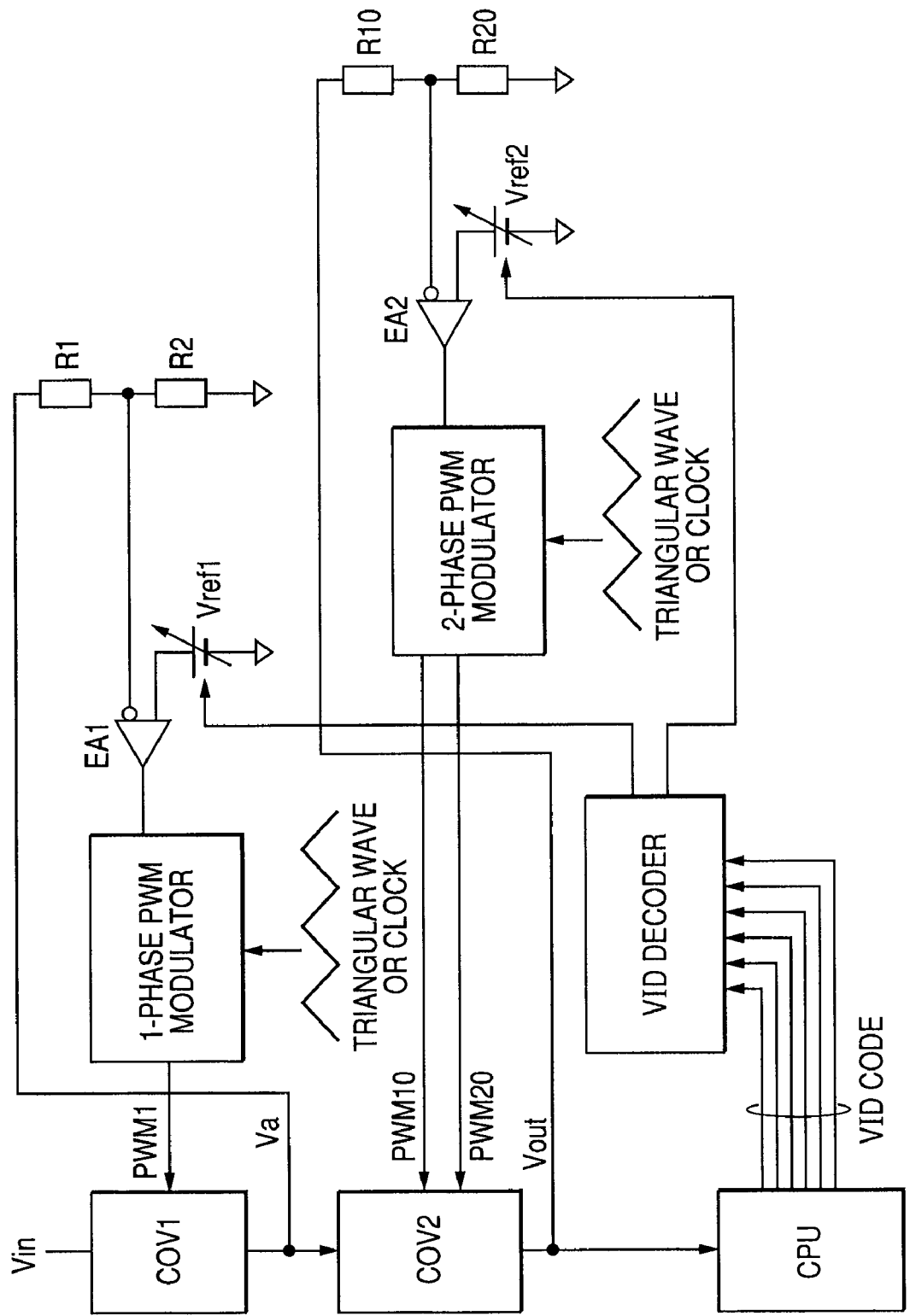
FIG. 7 is a block diagram of an embodiment of the PWM control circuit shown in FIG. 1.

FIG. 7 shows a block diagram of an embodiment for the PWM control circuit shown in FIG. 1. The output voltage Va from the first stage DC-DC converter COV1 is divided by resistors R1 and R2 (Va×R2/(R1+R2)). A first error amplifier EA1 compares the divided voltage (Va×R2/(R1+R2)) and a reference voltage Vref1 and inputs an error voltage into a single-phase PWM modulator. The single-phase PWM modulator generates a PWM pulse PWM1 by using a triangular wave or clock such that the divided voltage (Va×R2/(R1+R2)) and the reference voltage Vref1 become the same, and supplies the PWM pulse PWM1 to the drive circuit DV1 of the first DC-DC converter COV1.

The output voltage Vout from the second stage DC-DC converter COV2 is divided by resistors R10 and R20 (Vout× R20/(R10+R20)). A second error amplifier EA2 compares the divided voltage (Vout×R20/(R10+R20)) and a reference voltage Vref2 and inputs an error voltage into a two-phase PWM modulator. The two-phase PWM modulator generates the PWM pulses PWM10 and PWM20 by using a triangular wave or clock such that the divided voltage (Vout×R20/(R10+ R20)) and the reference voltage Vref2 become the same and supplies the PWM pulses PWM10 and PWM20 to the drive circuits DV10 and DV20, respectively, of the second stage DC-DC converter COV2. The two-phase PWM modulator makes a phase difference between the PWM pulses PWM10 and PWM20 to be 180 degrees by using the triangular wave or clock having a 180-degree phase difference.

In this embodiment, the PWM control circuit includes the VID decoder, which receives the VID code from the CPU of the load thereof. The VID decoder interprets the VID code and sets the output voltage Va of the first stage DC-DC converter COV1 depending on the setting of output voltage Vout and the number of phases of the second stage DC-DC converter COV2. For setting such output voltage Vout and output voltage Va, the reference voltage Vref2 and the reference voltage Vref1 are controlled, respectively.

For example, when a voltage dividing ratio by the resistors R10 and R20 is ½ and the output voltage Vout is set to be 1 V, the reference voltage Vref2 is controlled to be 0.5 V. Then, when a voltage dividing ratio by the resistors R1 and R2 is ¼ and the output voltage Va is set to be 2 V which is two times the output voltage Vout, the reference voltage Vref1 is controlled also to be 0.5 V.

Figure 8:
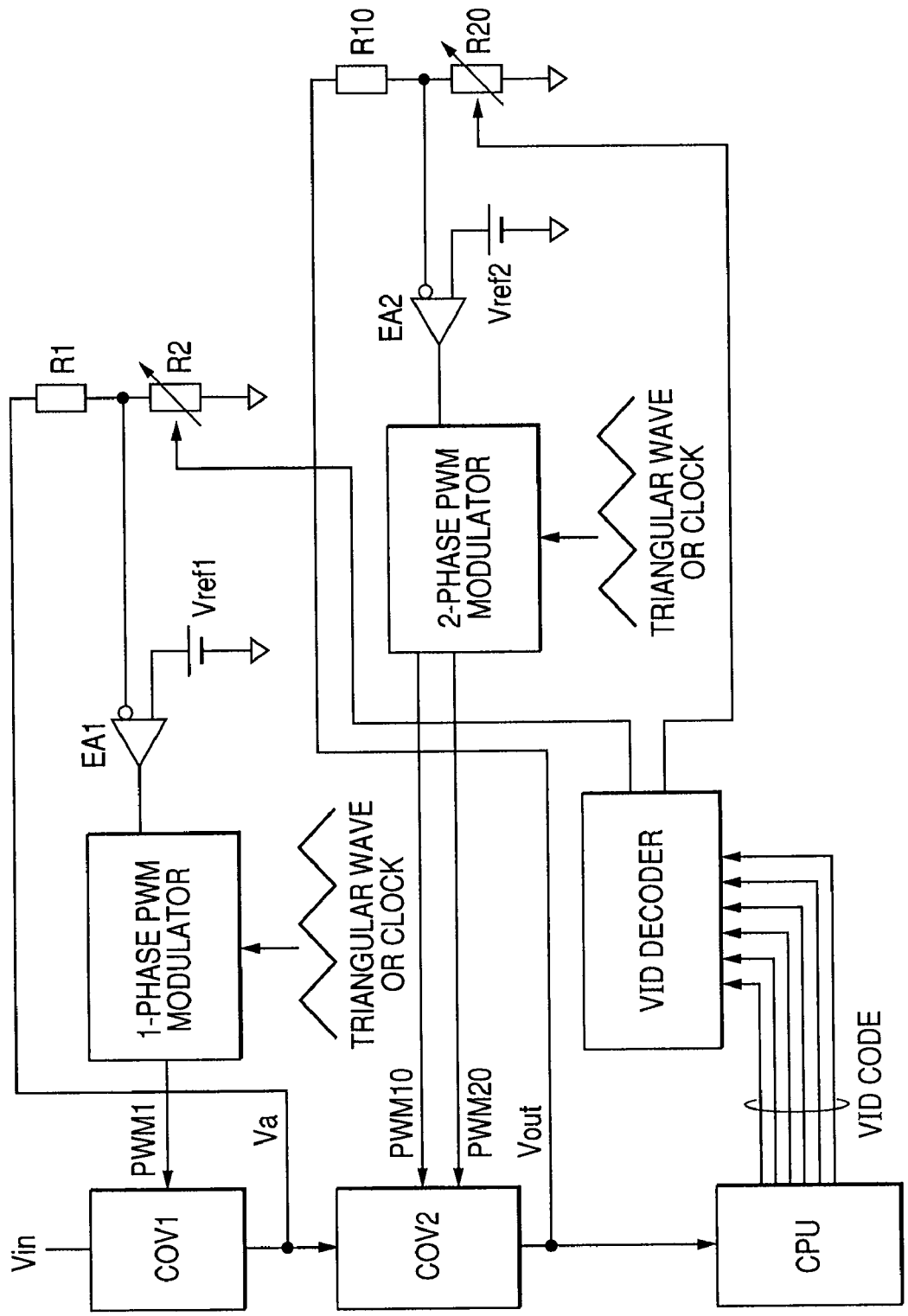
FIG. 8 is a block diagram of another embodiment of the PWM control circuit shown in FIG. 1.

FIG. 8 shows a block diagram of another embodiment of the PWM control circuit of FIG. 7. In this embodiment, an output signal from the VID decoder controls resistances of the voltage dividing resistors R2 and R20 instead of the reference voltages Vref1 and Vref 2. That is, by making the reference voltages Vref1 and Vref2 fixed voltages and controlling the divided voltage (Va×R2/(R1+R2) and the divided voltage (Vout×R20/(R10+R20), the output voltage Vout (Va) can be automatically set according to the VID code from the CPU or the like in the same manner as in FIG. 7.

Figure 9:
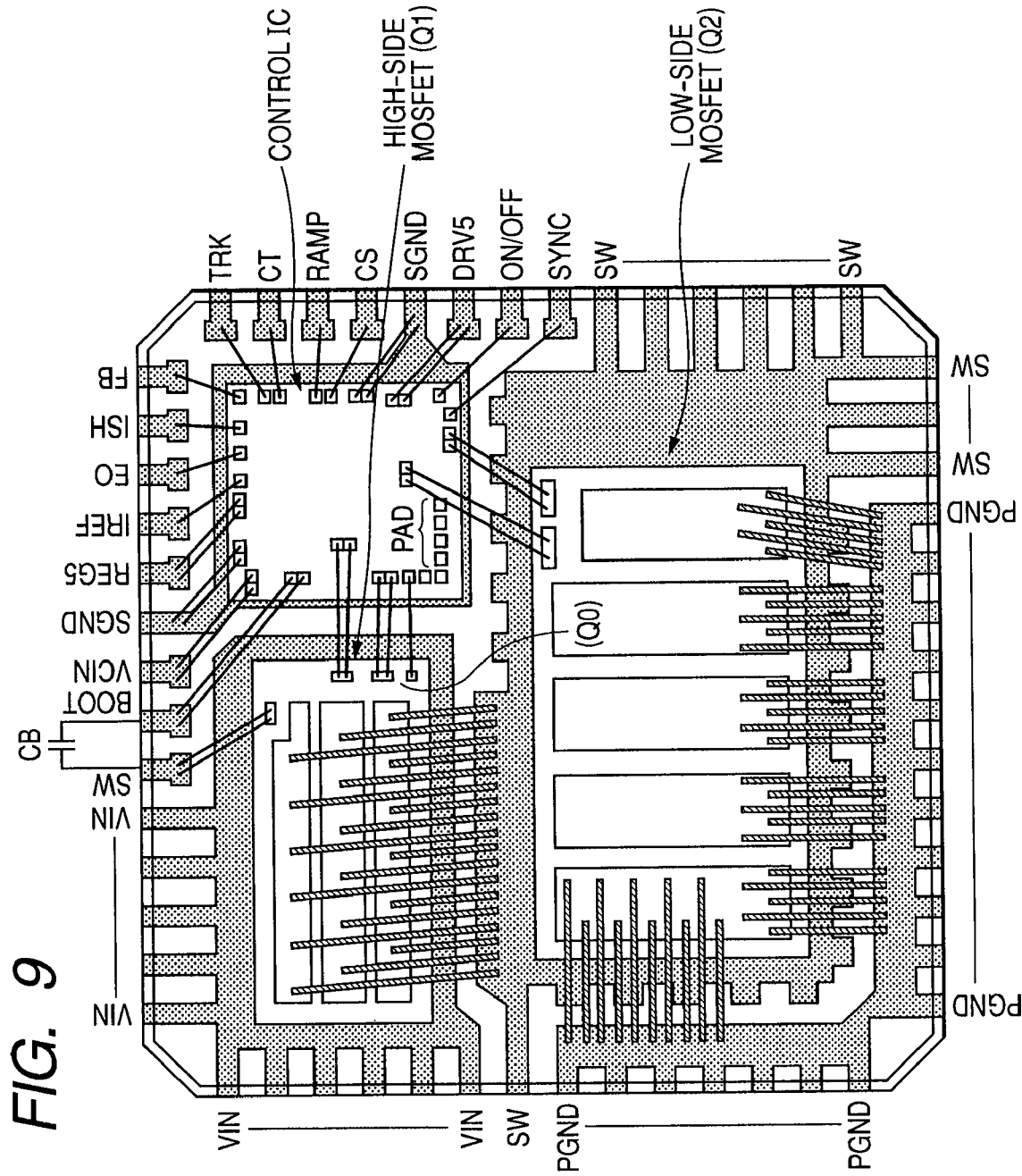
FIG. 9 is a configuration diagram of an embodiment of the semiconductor device which can be used for the power supply apparatus according to the present invention.

FIG. 9 shows a configuration of an embodiment for a semiconductor device which can be applied to the power supply apparatus according to the present invention. The drawing shows exemplarily a pin assignment and an internal configuration according to an actual semiconductor device. This embodiment is a multi-chip module (MCM) integrated circuit or a SIP (System in Package) which mounts three semiconductor chips in one package. The three chips include a high-side (high potential side) MOSFET Q1, a low-side (low potential side) MOSFET Q2, and a control IC, to be described below. The control IC includes drivers DV1 and DV2 driving the high-side MOSFET (Q1) and the low-side MOSFET (Q2), and a logic circuit LGC.

A chip mounting surface of a mounting substrate is divided approximately in half, and, on one side thereof, the two semiconductor chips of the high-side MOSFET (Q1) and the control IC are disposed side-by side, while, on the other side thereof, a semiconductor chip of the low-side MOSFET (Q2) is disposed. The semiconductor device of this embodiment, while having no particular restriction to the number of pins, is provided with 56 external terminals in total on the periphery of the chips and each of the external terminals is supplied with a signal or voltage as shown in the drawing. Circuit patterns on the mounting substrate are shown in a halftone correspondingly to the external terminals. Although not shown in the drawing, the rear side of the semiconductor device is provided with tab pads for such as input terminals VIN, output terminals SW, and PGND.

A sense MOSFET (Q0) is integrated with the high-side MOSFET (Q1), having a current of 1/N of a current flowing through the high-side MOSFET (Q1). The control IC includes various circuits forming a PWM signal to switch the high-side MOSFET (Q1) and the low-side MOSFET (Q2) by using a feedback signal obtained from the current detected by the sense MOSFET (Q0) and a feedback signal of the output DC voltage. Therefore, the control IC has a number of signal pads on the peripheral of the chip. For the external terminals of the semiconductor device to be connected to the pads provided in the control IC, the number of external terminals provided in a neighborhood of the control IC is not sufficient and terminals provided on the periphery of the mounting substrate around the high-side MOSFET (Q1) and the low-side MOSFET (Q2), BOOT, VCIN, SYNC, and ON/OFF, are also coupled to the pads provided in the control IC.

This embodiment provides the sense MOSFET (Q0), which has the same structure as the high-side MOSFET (Q1) and has a current of 1/N of the current thereof, included in one semiconductor chip as described above, using a MOSFET with a vertical structure for a high withstand voltage and a high efficiency, and thereby it is possible to suppress variations of pair ratios in threshold voltages Vth and on-resistances of the both MOSFETs (Q1 and Q0) caused in a production process to minimum values. Also, a change of the on-resistance by temperature rise is the same in the high-side MOSFET (Q1) and the sense MOSFET (Q0) and thereby the sense current has less temperature dependence. Accordingly, it is possible to control a peak current accurately by using these MOSFETs (Q0 and Q1).

In FIG. 9, bold solid lines and fine solid lines show bonding wires which are used for mutual connections of the control IC and the MOSFETs (Q0 and Q1) and (Q2) and connections thereof to the external terminals. An external terminal SW is an output terminal connected to a mutual connection node of the MOSFETs (Q1) and (Q2) in a circuit diagram and used for a connection with an inductor to be described below. For the external terminal SW used for the connection with the inductor, a plurality of external terminals SW extended from the circuit pattern of the mounting substrate mounting the low-side MOSFET (Q2) are utilized. Other than such plurality of external terminals SW, an external terminal SW coupled with the source of the high-side MOSFET (Q1) is provided for a connection to a bootstrap capacitance CB to be described below.

The drain of the low-side MOSFET (Q2) and the source of the high-side MOSFET (Q1) are connected by bonding wires shown by the bold solid lines and the source of the high-side MOSFET (Q1) and the external terminal SW for the connection to the bootstrap capacitance CB are connected by bonding wires shown by the two fine solid lines. By providing such an external terminal SW dedicated for the connection to the bootstrap capacitance, it is possible to dispose the external terminals SW and BOOT connected to the bootstrap capacitance CB adjacently as shown in the drawing and to realize an efficient boot strap operation. For example, when the bootstrap capacitance CB is connected between the external terminal BOOT and the external terminal SW connected with the inductor, the bootstrap capacitance CB is connected through a comparatively long wiring path and has an adverse effect of a wiring resistance thereof or the like.

Figure 10:
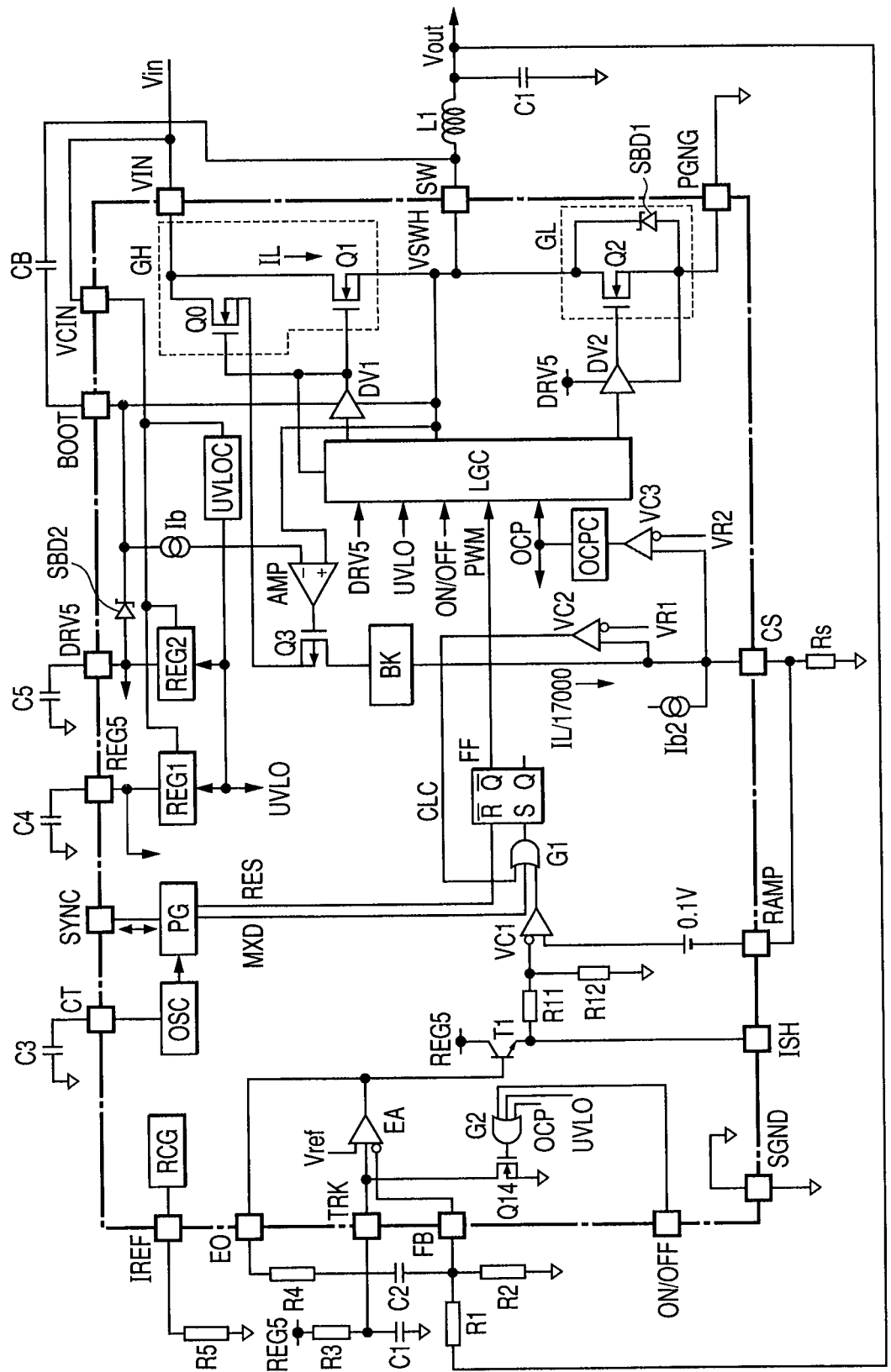
FIG. 10 is the whole circuit diagram of an embodiment of the semiconductor device shown in FIG. 9.

FIG. 10 shows the whole circuit diagram of an embodiment for the semiconductor device shown in FIG. 9. A portion of the drawing enclosed by a bold dashed line, while not strictly defined, shows the semiconductor device having multi-chip configuration shown in FIG. 9. That is, two power MOSFETs GH (Q0 and Q1) and GL (Q2) as shown by dotted lines and a control IC of other circuits are formed on semiconductor chips, respectively, and mounted in one package. The semiconductor chip GH is composed of the high-side MOSFET Q1 and the sense MOSFET Q0. An area ratio (current ratio) of the MOSFET Q1 to the MOSFET Q0 is set to be 17,000:1. The semiconductor chip GL is composed of the low-side MOSFET Q2. This semiconductor chip GL is provided with a schottky diode SBD1 between the source and the drain of the low-side MOSFET Q2. Then, the source of the low-side MOSFET Q2 is connected to an independent external terminal PGND for reducing an effect of a switching noise.

When the semiconductor device is used for the first stage DC-DC converter COV1 shown in FIG. 1, an input voltage Vin of such as approximately 20 V is supplied from a power supply terminal VIN. The voltage at the power supply terminal VIN is supplied to the drains of the MOSFETs Q0 and Q1.

While not always required, a power supply terminal VCIN may be provided. This terminal VCIN is connected with the VIN externally and supplied with the input voltage Vin. This input voltage Vin is supplied to a voltage detecting circuit UVLOC, power supply circuits REG1 and REG2 and also a reference current generating circuit RCG (not shown in the drawing). The voltage detecting circuit UVLOC detects that the input voltage is equal to or higher than a predetermined voltage and forms a detection signal UVLO. When the detection signal UVLO indicates that the input voltage is equal to or higher than the predetermined voltage, operations of the power supply circuits REG1 and REG2 and the logic circuit LGC become active.

The power supply circuits REG1 and REG2 receive the input voltage Vin of such as 20 V and form internal voltages (REG5 and DRV5, respectively) of approximately 5 V. External terminals REG5 and DRV5 are connected with capacitors C4 and C5, respectively, for stabilizing the internal voltages (REG5 and DRV5). The internal voltage (REG5) is an operating voltage of an error amplifier EA, an oscillator circuit OSC, a pulse generating circuit PG, voltage comparator circuits VC1 to VC3, etc. to be described below. The internal voltage (DRV5) is an operating voltage of the logic circuit LGC forming a switch control signal for the high-side MOSFETs Q0 and Q1 and the low-side MOSFET Q2 and a driver DV2 forming a drive signal supplied to the gate of the low-side MOSFET Q2.

The two power supply circuits REG1 and REG2 are provided in this configuration, even though the internal voltage REG5 and DRV5 are the same voltage of 5 V. The reason thereof is as follows. When such a large rated output current is set as described hereinabove, sizes of the high-side MOSFET (Q1) and the low-side MOSFET (Q2) inevitably become large as shown in FIG. 9. Particularly the size of the low-side MOSFET (Q2) becomes as large as about 1.5 times the size of the high-side MOSFET (Q1) because of a requirement of a low on-resistance for efficiency. AS a result, the gate capacitance thereof becomes large.

The driver DV2 provided in the control IC or the logic IC forming the input signal thereof needs to flow a large current for driving the above mentioned large load capacitance or the bootstrap capacitance CB in a high speed. The power supply circuit REG which can be realized in the control IC configured with CMOS circuits has a limitation in current supply capability thereof, and the output voltage changes considerably in the switching control of the MOSFET (Q2) and in pre-charge of the bootstrap capacitance CB. The control IC includes analog circuits such as the error amplifier EA, the voltage comparator circuits VC1 to VC3, and the oscillator circuit OSC. These analog circuits are sensitive to a change of the power supply voltage. Therefore, when the driver DV2, the logic circuit LGC, the analog circuits EA and VC1 to VC3, and the like formed on the control IC are operated with the same power supply circuit from the reason that the same voltage is required therefor, it is difficult to realize the PWM control with a high accuracy and a stable voltage converting operation as described below. Accordingly, the circuits provided in the control IC is divided into circuits sensitive to the power supply voltage change and circuits requiring large current supply, and the power supply circuits REG1 and the REG2 are provided for the circuits, respectively.

The internal voltage (DRV5) is supplied to a schottky diode SBD2 composing a booster circuit and to one end of the bootstrap capacitance CB via the terminal BOOT. The other end of the bootstrap capacitance CB is connected to the external terminal SW. The external terminal SW is connected to the source of the MOSFET Q1 and the drain of the MOSFET Q2 and also to an input side of the inductor L1. In the semiconductor device of FIG. 9, the dedicated external terminal SW is provided as described above and the external terminal BOOT is arranged to be adjacent to the external terminal SW. The capacitor C1 is provided between the other end of the inductor L1 and a ground potential of the circuit, where the output voltage Va of such as 2V is formed to become the input voltage of the second stage DC-DC converter COV2.

The source of the MOSFET Q0 and the source of the MOSFET Q1 are connected to input terminals (+) and (−) of a differential amplifier AMP. This differential amplifier AMP operates to obtain the sense current with a high accuracy by providing the same source potential for the MOSFETs Q0 and Q1. A MOSFET Q3, in which the sense current formed by the MOSFET Q0 flows, is configured by an LD-MOSFET. The drain of the MOSFET Q3 is connected to an external terminal CS via a blanking circuit BK, where a resistor Rs is connected for a conversion to a voltage signal.

The voltage signal generated at the external terminal CS is used for a feedback signal CS. The voltage formed at the resistor Rs is compared with the reference voltage VR corresponding to a limiter current in the voltage comparator circuit VC2, and an output of the voltage comparator circuit VC2 sets a flip-flop circuit FF via an OR-gate G1 to make the PWM signal to exhibit a low level, which switches the high-side MOSFETs Q0 and Q1 into off states. Since the sense current formed in the MOSFET Q0 generates a noise at the time of switching, the blanking circuit BK is provided for blanking the sense current detection for several tens of nanoseconds to prevent a false operation.

The output voltage Vout is divided by the resistors R1 and R2 and input into an external terminal FB. The divided voltage input into the external terminal FB is input into the error amplifier EA as a feedback signal VF. The error amplifier EA takes out a difference thereof from the reference voltage Vref. An output signal of the error amplifier EA is transferred to the voltage comparator circuit VC1 after a noise component thereof is eliminated by a compensation circuit composed of a resistor R4 and a capacitor C2 provided at an external terminal EO. A resistor R3 and the capacitor C1 provided at an external terminal TRK form a soft start signal and transfer the signal to the error amplifier EA. That is, the output voltage Vout is controlled to rise gradually according to the soft start signal immediately after the power supply is switched on. The oscillator circuit OSC performs a frequency setting with a capacitor C3 connected to an external terminal CT and a constant current and sets a frequency of the PWM signal. A pulse formed in this oscillator circuit OSC is supplied to the pulse generating circuit PG to form a reset signal RES of the flip-flop circuit FF and a maximum duty signal MXD as a forced set signal.

In a peak current control method, the reset signal RES formed by the oscillator circuit OSC resets the flip-flop circuit FF and provides a rise to the PWM signal obtained from an inverted output /Q thereof. Thereby, the high-side MOSFET Q1 is turned on and the sense current thereof IL/17,000 is detected by the MOSFET Q0 to become a voltage signal. Then, in a voltage comparator circuit VC1, the voltage signal is compared with a differential output EO formed by the error amplifier EA from the divided output voltage Vout and the reference voltage Vref. When a voltage corresponding to the sense current IL/170,000 reaches the voltage EO, the flip-flop circuit FF is made to be set to change the PWM signal to exhibit a low level. Thereby, the high-side MOSFETs Q0 and Q1 are turned off and instead the low-side MOSFET Q2 is switched to an on-state.

The logic circuit LGC is provided with a circuit which sets a dead time such that the high-side MOSFET Q1 and the low-side MOSFET Q2 do not become the on-state at the same time, and a level shift circuit converting a control voltage to be transferred to the high-side MOSFETs Q0 and Q1 into a signal level corresponding to the boosted voltage.

The semiconductor device of this embodiment is devised to be applied for a highly accurate current share by connecting the outputs of the error amplifiers EA with each other, when switching power supplies are connected in parallel. For the current share, the output of the error amplifier EA is connected to an external terminal ISH via a diode (base and emitter of a transistor T1). For example, the external terminals ISH of the semiconductor devices composing the two switching power supplies may be connected with each other. By the mutual connection of the external terminals ISH in this manner, the output voltages of the error amplifiers EA in the two switching power supplies are shared with each other and the error amplifiers EA operate to form similar output voltages Vout, and thereby the sharing becomes possible to increase a supply capability of the output current twice. That is, as described hereinafter, when a plurality of switching power supplies is operated in parallel, it is an important requirement to distribute output current such that the currents IL flowing in the respective switching power supplies become the same for preventing a particular switching power supply from bearing a larger current and resulting in thermal runaway.

In this embodiment, while not always required, there may be provided a monitor circuit as follows. The monitor circuit includes the voltage detecting circuit UVLOC monitoring that the input voltage VIN becomes equal to or smaller than a predetermined voltage (signal path thereof is omitted in the drawing), and a monitoring circuit OCPC monitoring that the output current becomes equal to or larger than a predetermined current (over current) using the feedback signal CS. Detected signals from these monitor signals UVLO and OCP are input into the logic circuit LGC and forcibly turn off the output MOSFETs Q0, Q1, and Q2 regardless of the PWM signal. Also, these signals UVLO and OCP and an operation control signal ON/OFF of the switching power supply are input into an OR gate circuit G2 and turn on a MOSFET Q14 to make an external terminal TRK low level. Thereby, it is devised to stop the output of the error amplifier.

A reference current generating circuit RCG has a publicly known band-gap circuit. A constant voltage formed in this band-gap circuit is applied to a resistor R5 connected to an external terminal IREF to form a reference current. On the basis of this reference current, there are formed the reference voltages Vref, VR1, and VR2 or constant current sources Ib, Ib1, and I1 to I4 which are required in the internal circuit.

The single-phase DC-DC converter COV1 shown in FIG. 1 can be configured by the semiconductor device as shown in FIG. 10 and external components. Then, the two-phase DC-DC converter COV2 shown in FIG. 1 can be configured by use of two semiconductor devices of FIG. 10 connected as follows. The power supply voltage REG5 is applied to the external terminal CT via a resistor R in one semiconductor device shown in FIG. 10. Thereby, in the semiconductor device, a synchronization terminal SYNC is made to become an input mode by operations of the oscillator circuit OSC and a voltage judging circuit VD. Then, a pulse formed by the oscillator circuit OSC in the other semiconductor device is input and inverted to be supplied to the pulse generating circuit PG which carries out a synchronization operation providing a phase different from the other semiconductor device by 180 degrees. Thereby, the two semiconductor devices have clock phases inverted from each other by 180 degrees and perform the two-phase operation.

Figure 11:
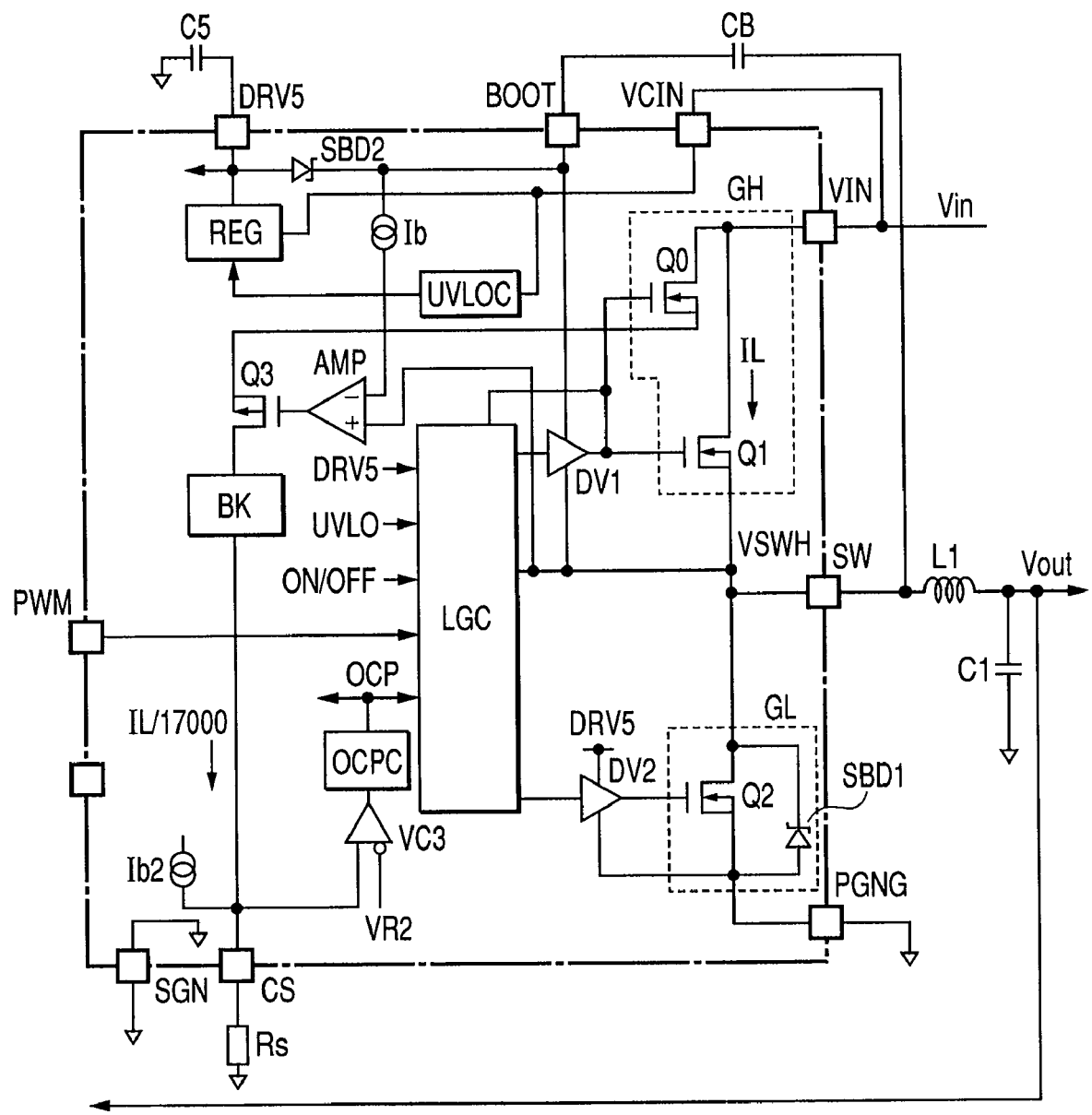
FIG. 11 is the whole circuit diagram of another embodiment of the semiconductor device which can be used for the present invention.

FIG. 11 shows the whole circuit diagram of another embodiment for the semiconductor device used for the present invention. A portion enclosed by a bold dashed line in the drawing shows the semiconductor device with the multi-chip configuration shown in FIG. 9. This embodiment eliminates circuits related to a part generating the PWM pulse from the configuration shown in FIG. 10. This can make the control IC simpler, and this semiconductor device can be used for the first stage DC-DC converter COV1 and also for the first and second phase circuits PHS1 and PHS2 in the second stage DC-DC converter COV2 shown in FIG. 1. By providing the PWM control circuit PWMC commonly to the above three semiconductor devices, it is possible to avoid duplication of the part generating the PWM pulse and to make the circuit as a whole simpler.

This embodiment can cancel the ripple current, since phases of the ripple currents in the respective phase circuits are shifted in the second stage DC-DC converter COV2 The output voltage Va of the first stage DC-DC converter COV1 is not affected by an output voltage change (load change) of the second stage converter COV2 and thereby it is possible to configure a stable high-speed power supply. There is a merit that a switching loss is not increased so much by increasing a switching frequency of the second stage converter COV2, since the input voltage Va of the second stage converter COV2 is low as 2 V. Further, it is possible to reduce a power loss, since the first stage DC-DC converter COV1 which has a large difference between the input voltage and the output voltage is configured to be a switching regulator.

For example, the PWM signal frequency can be increased up to about 2 MHz in the second stage converter COV2. It is useful to operate the first stage converter COV1 at a low switching frequency like 200 KHz compared with the second stage converter COV2, since the first stage converter COV1 has a high input voltage and a large switching loss. There are two merits for increasing the switching frequency of the second stage converter COV2. It is possible to use a choke coil having a lower inductance value and to realize a higher-speed load response since a bandwidth of the converter itself can be made wider.

Hereinabove, the invention achieved by the inventor has been described specifically according to the embodiments. However, the present invention is not limited to the embodiments and can be variously modified without departing the spirit of the invention. For example, the second stage DC-DC converter COV2 may be configured by use of four phases or more. The PWM signal frequencies of the first stage converter COV1 and the second stage converter COV2 may or may not be synchronized. Generally, it is preferable to make the frequency higher in the second stage converter COV2 than in the first stage converter COV1. For the first stage DC-DC converter COV1 and the first and second phase circuits PHS1 and PHS2 in the second stage DC-DC converter COV2, specific configurations thereof are not limited to the embodiments and can have various embodiments. For example, either one of the output MOSFETs Q1 and Q2 may be configured as a single element and assembled as an external element together with inductors or capacitors on a mounting board composing a power supply apparatus.

The present invention can be applied widely to power supply apparatuses.

What is claimed is:

1. A power supply apparatus, comprising:
   a first switching regulator receiving an input voltage and forming a first voltage; and
   a second switching regulator receiving the first voltage and forming a second voltage,
   wherein the second switching regulator includes an N-phase (N is two or more) switching regulator that has N output circuits;
   wherein the first voltage is set to be N times a target value of the second voltage; and
   wherein the input voltage is set to be higher than the first voltage.

2. The power supply apparatus according to claim 1,
   wherein the first switching regulator is a single-phase switching regulator operated by a first PWM pulse.

3. The power supply apparatus according to claim 2,
   wherein the second switching regulator includes:
      the N output circuits;
      N inductors each having one-end thereof coupled to an output terminal of each of the N output circuits; and
      a capacitor being coupled in common to the other ends of the N inductors and forming the second voltage; and
   wherein the N output circuits are supplied with N-phase second PWM pulses each having a phase difference corresponding to 360 degrees/N.

4. The power supply apparatus according to claim 3,
   wherein the N-phase second PWM pulses are formed by an N-phase PWM modulator receiving a triangular wave or clock signal.

5. The power supply apparatus according to claim 4,
   wherein a frequency of the first PWM pulse is set to be lower than that of the second PWM pulses.

6. The power supply apparatus according to claim 5, further comprising a VID decoder:
   wherein the first voltage is set according to a first control signal of the VID decoder; and
   wherein the second voltage is set according to a second control signal of the VID decoder.

7. The power supply apparatus according to claim 6:
   wherein a first reference voltage supplied to a first error amplifier composing the first switching regulator is controlled by the first control signal of the VID decoder to set the first voltage; and
   wherein a second reference voltage supplied to a second error amplifier composing the second switching regulator is controlled by the second control signal of the VID decoder to set the second voltage.

8. The power supply apparatus according to claim 6:
   wherein the first switching regulator forms the first voltage according to an output signal of a first error amplifier that receives a first reference voltage and a first divided voltage of the first voltage, the first divided voltage being controlled by the first control signal of the VID decoder to set the first voltage; and
   wherein the second switching regulator forms the second voltage according to an output signal of a second error amplifier that receives a second reference voltage and a second divided voltage of the second voltage, the second divided voltage being controlled by the second control signal of the VID decoder to set the second voltage.

9. The power supply apparatus according to claim 5:
   wherein the first switching regulator includes a first semiconductor device that has a first drive circuit receiving the first PWM pulse and an output MOSFET circuit driven thereby in one package;

wherein the second switching regulator includes N-phase second semiconductor devices that have N drive circuits receiving the second PWM pulses having N phases, respectively, and N output MOSFET circuits driven thereby, respectively, in one package; and wherein the power supply apparatus further comprises a third semiconductor device that is provided in common to the first semiconductor device and the N second semiconductor devices and forms the first PWM pulse and the second PWM pulses having N phases.

10. The power supply apparatus according to claim 9, wherein the third semiconductor device further includes a VID decoder;

wherein the first voltage is set according to a first control signal of the VID decoder; and wherein the second voltage is set according to a second control signal of the VID decoder.

11. The power supply apparatus according to claim 10, wherein each of the first and second semiconductor devices includes a first, a second, and a third semiconductor chips;

wherein the first semiconductor chip forms the drive circuit;

wherein the second semiconductor chip forms one output MOSFET of the output MOSFET circuit and is a first power MOSFET that has a vertical MOS structure in which current flows in a vertical direction of the semiconductor chip; and wherein the third semiconductor chip forms the other output MOSFET of the output MOSFET circuit and is a second power MOSFET that has a vertical MOS structure in which current flows in a vertical direction of the semiconductor chip.

* * * * *